US008659895B1

(12) United States Patent
Carlson et al.

(10) Patent No.: US 8,659,895 B1
(45) Date of Patent: Feb. 25, 2014

(54) AIR-COOLED DATA CENTER ROWS

(75) Inventors: Andrew B. Carlson, Atherton, CA (US);
Christopher G. Malone, Mountain View, CA (US); Thomas R. Kowalski, Ben Lomond, CA (US); Jimmy Clidaras, Los Altos, CA (US)

(73) Assignee: Google Inc., Mountain View, CA (US)

( * ) Notice: Subject to any disclaimer, the term of this patent is extended or adjusted under 35 U.S.C. 154(b) by 265 days.

(21) Appl. No.: 13/107,205

(22) Filed: May 13, 2011

(51) Int. Cl.
*H05K 7/20* (2006.01)

(52) U.S. Cl.
USPC ............................. 361/694; 361/695; 454/184

(58) Field of Classification Search
USPC ......................................................... 361/694
See application file for complete search history.

(56) References Cited

U.S. PATENT DOCUMENTS

| | | | |
|---|---|---|---|
| 8,047,904 B2 * | 11/2011 | Yates et al. ..................... | 454/118 |
| 2005/0022967 A1 | 2/2005 | Hall | |
| 2005/0219811 A1 * | 10/2005 | Coglitore et al. ............. | 361/687 |
| 2006/0176664 A1 | 8/2006 | Casebolt | |
| 2008/0123288 A1 * | 5/2008 | Hillis ............................ | 361/687 |
| 2008/0158818 A1 | 7/2008 | Clidaras et al. | |
| 2009/0251860 A1 * | 10/2009 | Belady et al. .................. | 361/690 |
| 2009/0277605 A1 * | 11/2009 | VanGilder et al. .............. | 165/67 |
| 2010/0110626 A1 * | 5/2010 | Schmitt et al. ........... | 361/679.47 |
| 2012/0162906 A1 * | 6/2012 | Jai ............................. | 361/679.53 |

OTHER PUBLICATIONS

International Search Report and Written Opinion for PCT Application No. PCT/US2012/037536, dated Nov. 29, 2012, 9 pages.

* cited by examiner

*Primary Examiner* — Gregory Thompson
(74) *Attorney, Agent, or Firm* — Fish & Richardson P.C.

(57) ABSTRACT

A computer data center system includes stacks of computers, each of the stacks computer motherboard assemblies arranged vertically with respect to one another, a first row of stacks, the row defined by stacks arranged adjacent to each other in a horizontal line of stacks, and a cool air supply plenum adjacent to the first row of stacks. The cool air supply plenum supplies cool air to a first side of the first row of stacks for cooling computers placed in the stacks, and has a longitudinal axis substantially parallel with an average air flow of cooling air in the plenum. Computer assemblies in the first row of stacks include portions that are closer to the longitudinal axis of the cool air supply plenum than other portions of the same assemblies, or portions of adjacent computer assemblies that are closest to the longitudinal axis for the adjacent assemblies.

27 Claims, 13 Drawing Sheets

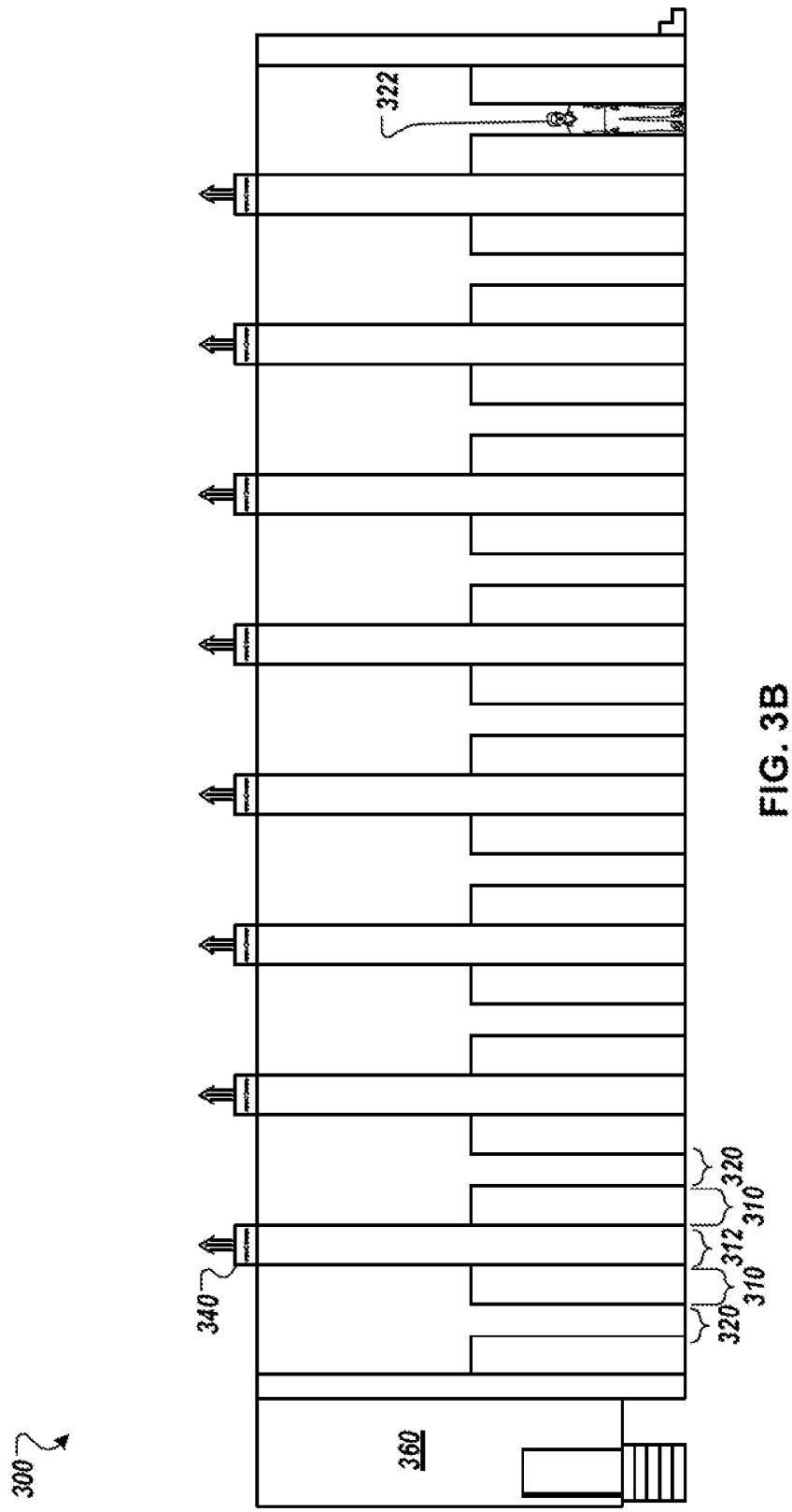

AIR-COOLED DATA CENTER ROWS

TECHNICAL FIELD

This document relates to data center cooling.

BACKGROUND

Computer users often focus on the speed of computer microprocessors (e.g., megahertz and gigahertz). Many forget that this speed often comes with a cost—higher electrical power consumption. For one or two home PCs, this extra power may be negligible when compared to the cost of running the many other electrical appliances in a home. However, in data center applications, where thousands of microprocessors may be operated, electrical power requirements can be very important. Not only must a data center operator pay for electricity to operate its many computers, but the operator must also pay to cool the computers. For example, a pair of microprocessors mounted on a single motherboard can draw 200-400 watts or more of power. Multiply that figure by several thousand (or tens of thousands) to account for the many computers in a large data center, and one can readily appreciate the amount of heat that can be generated.

The cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in heat generally can cause increases in microprocessor errors and failures.

SUMMARY

This specification describes technologies relating to cooling in data centers and to routing of airflow in a data center to provide cooling of computers and other electronic devices in the data center. As described in certain examples here, racks for electronics may be arranged so as to progressively extend into a flow of air past the racks. For example, the racks may each be rotated slightly into the air that flows down a cool-air aisle in a data center. Such an arrangement may create a saw-tooth pattern from the fronts of the racks so that the trailing corner of each rack sticks out into the airflow relative to the front corner of each rack. In addition, or alternatively, each rack down a data center aisle in the direction of airflow down the aisle may be stepped out slightly into the aisle from the prior rack so that the trailing edge of a subsequent rack steps out into the aisle and the flow more than that of the prior rack. Thus, the flow of the air down an aisle in a data center—or at least the amount of flow that extends beyond the leading corner but not the trailing corner—may be "caught" by the trailing corner and directed into the rack by a wall that extends back into the rack from the trailing corner. Where the racks are rotated into the flow in the aisle, the airflow into the racks may also be simplified because it will only need to turn through less than a right angle. Similar techniques can be employed when the airflow is vertical, such as by stepping each level in a rack out into an aisle when the airflow is provided from overhead.

Such approaches may be accompanied by various other structures or techniques. For example, rotating strips may be provided at the downstream edges of computer racks and can be extended into an airflow to catch the air and direct it into a rack. At a system level, rows of racks may be arranged within a data center so as to draw in supply air in particular manners and to get rid of heated air for recirculation or exhaust in various other manners. For example, one wall of a data center may be open to ambient outdoor conditions and may supply cool air to rows of racks arranged in the manners discussed above. The air may then be circulated through racks and be heated, may be captured in a warm air plenum, and then may be exhausted out a roof of a facility or another wall of the facility, such as the wall that is opposite where the air entered the building. Similarly a facility may be arranged to have two levels, with the lower level housing a cool air plenum and the racks, like those discussed here, and the upper level in the form of an attic. The air in such a system may be introduced at one end of the cool air plenum, circulated through the racks and routed into the attic, and then circulated back to the starting end, while being cooled at some point on its return.

In some implementations, the techniques and systems discussed here may provide one or more advantages. For example, air circulation may be simplified so that a complete circulation cycle involves less pressure drop, and thus requires less fan power and electricity to operate. Properly implemented, the techniques may better balance airflow throughout a system, and may thus more evenly cool components in a data center and lower the incidence of hot spots and thus equipment failure. The techniques may also, in certain implementations, be used with water-side or air-side economizer systems, which may provide further energy efficiency.

In one implementation, a computer data center system includes a plurality of stacks of computers, each of the stacks having a plurality of computer motherboard assemblies arranged vertically with respect to one another, a first row of stacks, the row defined by stacks arranged adjacent to each other in a horizontal line of stacks, and a cool air supply plenum adjacent to the first row of stacks. The cool air supply plenum being arranged to supply cool air to a first side of the first row of stacks for cooling computers placed in the stacks of the first row of stacks, and having a longitudinal axis substantially parallel with an average air flow of cooling air in the plenum. Computer assemblies in the first row of stacks include portions that are substantially closer to the longitudinal axis of the cool air supply plenum than other portions of the same computer assemblies, or portions of adjacent computer assemblies that are closest to the longitudinal axis for the adjacent computer assemblies.

Various embodiments may include some, all, or none of the following features. Ones of the stacks in the first row of stacks may define longitudinal axes that intersect at a substantially right angle their front faces that face the cool air supply plenum, the longitudinal axes of the stacks being at an angle between 15 degrees and 75 degrees from the longitudinal axis of the cool air supply plenum, so that air in the cool air supply plenum moving at the average air flow turns substantially less than a right angle when turning to align with the longitudinal axes of the stacks. The first row of stacks may include adjacent stacks whose center points move progressively closer to the longitudinal axis of the supply air plenum in a downstream direction for the average air flow. The center points may move progressively closer to the longitudinal axis of the supply air plenum in a downstream direction for the average air flow along substantially an entire length of the first row. The first row of stacks may include adjacent stacks having faces that are substantially non-parallel to, and center points that are substantially equidistant along a length of multiple adjacent stacks to, the longitudinal axes of the supply air plenum. Particular motherboard assemblies in the stacks may be located progressively farther from the longitudinal axis of the supply air plenum, so that faces of adjacent motherboard assemblies in the stack step backward or forward from the cool air plenum when moving upward in the stack. Motherboard assemblies may be stepped back about 1 inch or more from next-adjacent motherboard assemblies. The longitudinal axes of the supply air plenum may be vertical. The system may include a second row of stacks adjacent to and parallel with the first row of stacks, the stacks on opposed sides of, and open to, the supply air plenum, and having warm air plenums on their sides that are opposed to the supply air plenum, the warm air plenum being physically separated from the supply air plenum so as to prevent mixing of air between the plenums. The supply air plenum may receive air from a side wall of the data center, and the warm air plenum exhausts air to atmosphere through a roof or floor of the data center. The supply air plenum may receive air from a first side wall of the data center, and the warm air plenum exhausts air to atmosphere through a second side wall of the data center. The first wall may be on an opposed side of the data center to the second wall, so as to prevent mixing of intake air and exhaust air. The system may further comprise a plurality of paired rows of stacks, each first row in a particular paired row separated by a warm air plenum from a second row in the particular paired row, and each paired row separated from a next adjacent paired row by a supply air plenum. The system may further comprise a fan-powered ventilation system arranged to circulate air from back sides of the stacks, through cooling coils and to the supply air plenum. The ventilation system may be located immediately above an upper surface of the stacks, and supplies cooled air into a workspace in the data center.

In a second implementation, a method for providing air circulation in a data center includes circulating a mass of air in an average direction through a supply air plenum, and directing first air from the supply air plenum into the computer racks and circulating the captured air across computer equipment in the computer racks. The first air is directed by a face portion of a rack system that extends into the supply air plenum substantially farther than other face portions of the rack system, or a face portion of a rack system that extends into the supply air plenum farther than a face portion of a next adjacent rack systems extends into the supply air plenum.

Various implementations may include some, all, or none of the following features. The face portion of the rack system may be angled between 15 degrees and 75 degrees relative to an average direction of air flow in the supply air plenum. The first row of stacks may include adjacent stacks whose center points move progressively closer to a line defining an average direction of airflow in the supply air plenum in a downstream direction for air flow in the supply air plenum. The center points may move progressively closer to the line in a downstream direction for air flow along substantially an entire length of the first row. The first row of stacks may include adjacent stacks having faces that are substantially non-parallel to, and center points that are substantially equidistant along a length of multiple adjacent stacks to, the longitudinal axes of the supply air plenum. Particular motherboard assemblies in the stacks may be located progressively farther from the longitudinal axis of the supply air plenum, so that faces of adjacent motherboard assemblies in the stack step backward or forward from the cool air plenum when moving upward in the stack. The longitudinal axes of the supply air plenum may be vertical. The method may also include providing a second row of stacks adjacent to and parallel with the first row of stacks, the stacks of the second row of stacks on opposed sides of, and open to, the supply air plenum, and having warm air plenums on their sides that are opposed to the supply air plenum, the warm air plenum being physically separated from the supply air plenum so as to prevent mixed of air between the plenums. The supply air plenum may receive air from a side wall of the data center, and the warm air plenum exhausts air to atmosphere through a roof or floor of the data center. The method may also include providing a plurality of paired rows of stacks, each first row in a particular paired row separated by a warm air plenum from a second row in the particular paired row, and each paired row separated from a next adjacent paired row by a supply air plenum. The method may also include providing a fan-powered ventilation system arranged to circulate air from back sides of the stacks, through cooling coils and to the supply air plenum. A fan-powered ventilation system may be arranged to circulate air from back sides of the stacks, through cooling coils and to the supply air plenum.

DESCRIPTION OF DRAWINGS

Like reference symbols in the various drawings indicate like elements.

DETAILED DESCRIPTION

The large number of computers operating in a computer data center can generate a great deal of heat. This heat can be damaging to the computers, and therefore need to be removed. Generally, computers are air-cooled wherein relatively cool air is drawn across the computers to absorb the generated heat (though water cooling may be provided in spot applications such as on microprocessors and other high-heat-generating components). In a typical data center, the cool air travels along paths (e.g., along aisles between rows of computers, or upward/downward from ventilation ducts) that are, in the main, substantially perpendicular to the ventilation inlets of the computers. As such, the cool, moving air may have to make a substantially right-angle turn in order to enter the air space of the computers, whether the bulk direction of the supply air is originally downward from overhead ducts or longitudinally down workspace aisles that separate rows of racks from each other. This change in direction can increase the resistance of the air flow, which supply fans or blowers must use power to overcome.

This document describes methods and systems that can conserve power while cooling a data center by orienting computers such that cooling air is able to flow through the computers with decreased resistance.

Figure 1A:
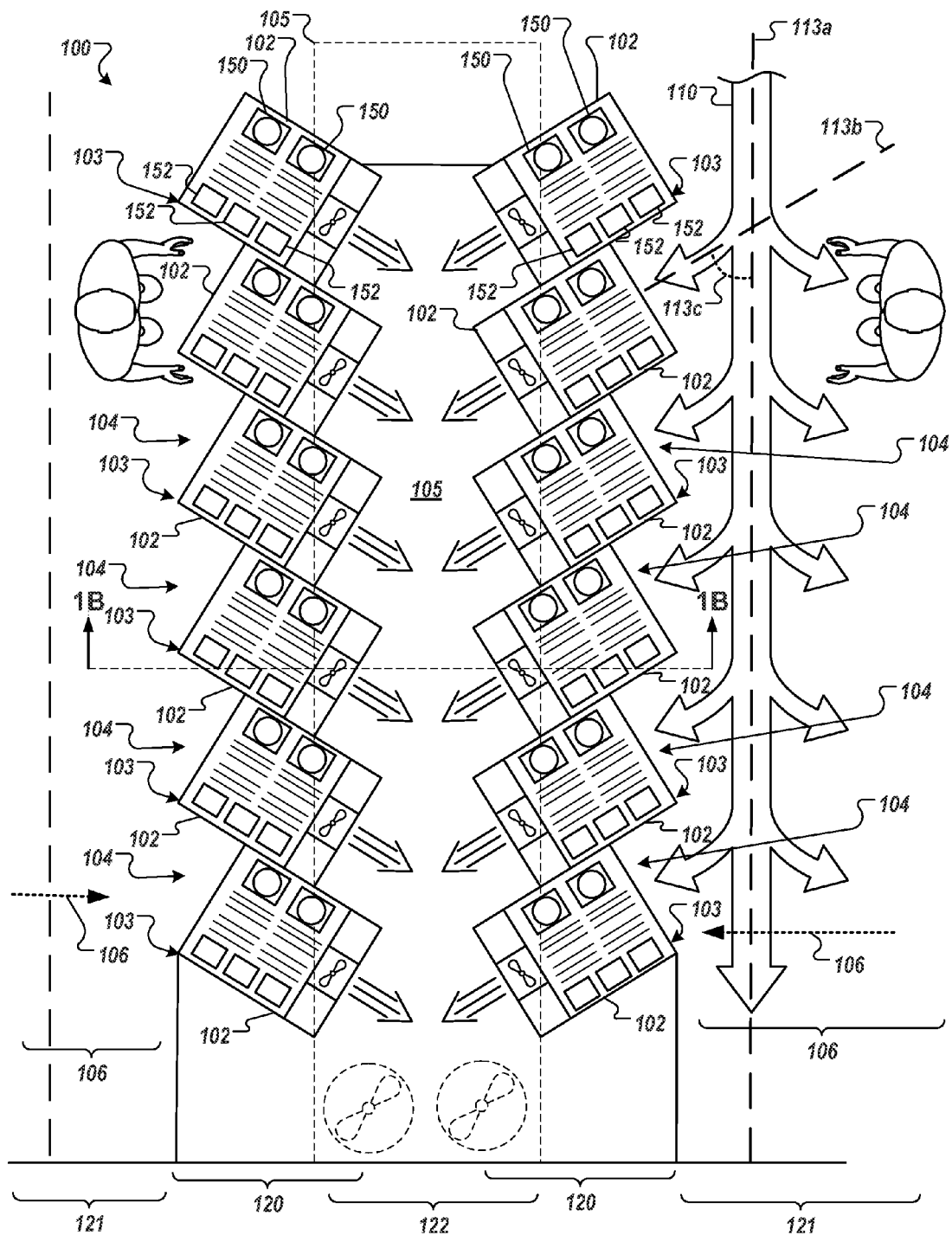
FIG. 1A is a plan view of adjacent rows of computer racks in a datacenter arranged in an angled manner.
Figure 1B:
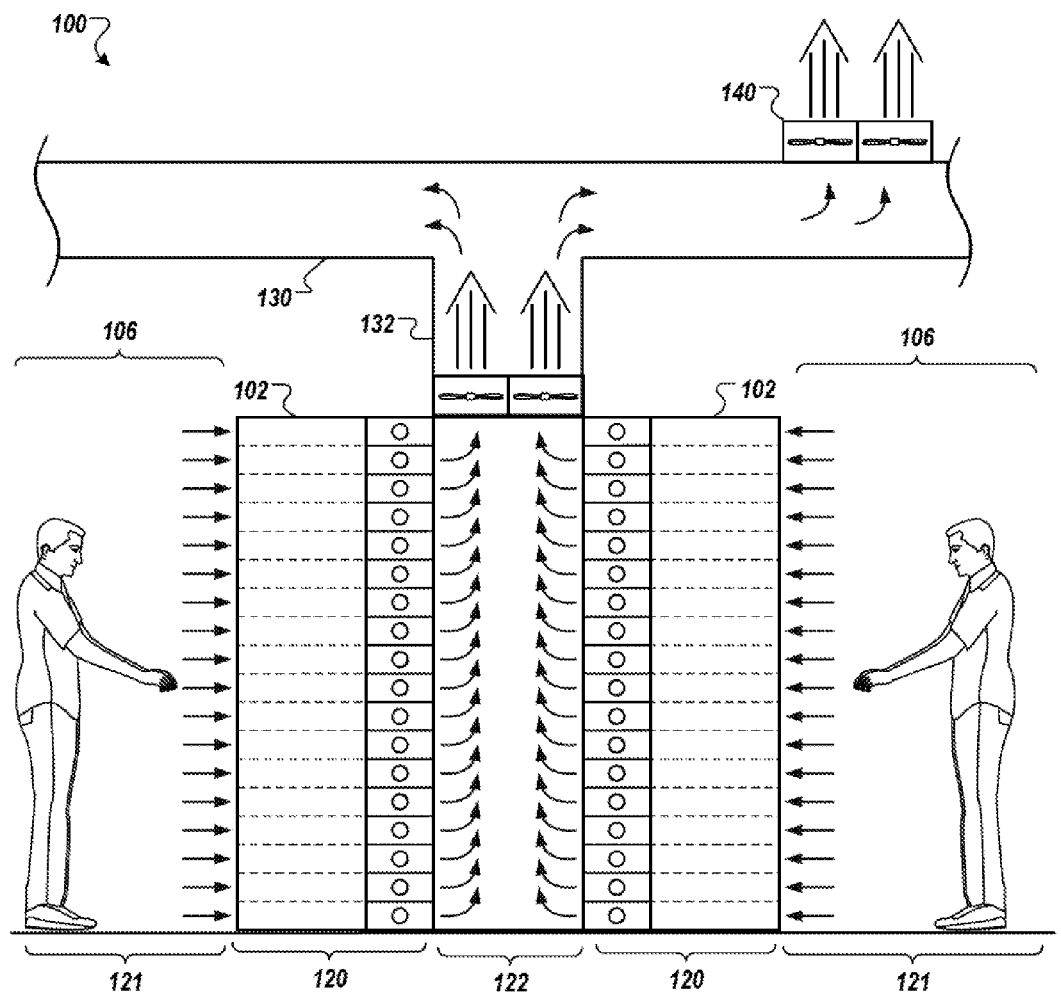
FIG. 1B shows a sectional view of FIG. 1A.

FIG. 1A is a plan view of adjacent rows of computer racks in a data center 100 arranged in an angled manner, and FIG. 1B is a sectional view of FIG. 1A. The view shown here is a close-up of a small portion of a much larger data center 100 that could house thousands of racks and hundreds of thousands of computer motherboards that may each support two to sixteen processors (or more) that each include a number of discrete processor cores.

The data center 100 is provided in a building that houses a large number of computers or similar heat-generating electronic components, such as networking equipment, electrical supply equipment, and other equipment to support the operations of the data center 100. A work space 106 is defined around the computers, which are arranged in a number of rows and mounted in vertical stacks, such as stacks 102, with human-occupiable aisles in the work spaces 106 between rows of the stacks 102. A warm air plenum 105 is defined between the back sides of the stacks 102 (e.g., a space substantially containing the warm air exhausted by the stacks 102). Each stack 102 may individually make up a rack that may be removed from the row and replaced with a new rack, or multiple stacks 102 may be joined together to make a particular rack.

In the particular implementation shown, the stacks 102 are arranged in rows 120, such that the rows 120 are defined by stacks 102 arranged adjacent to each other in a horizontal line of stacks 102. A cool air supply plenum 121 is adjacent to the stacks 102. The cool air supply plenum 121 supplies cool air to the intake sides of the rows 120 of stacks 102 for cooling computers placed in the stacks 102 of the rows 120. The plenum includes a human-occupiable aisle that has a longitudinal axis 113a substantially parallel with an average or bulk air flow of cooling air along a cool air path 110. In some implementations, the cool air flow path 110 can begin in the data center 100 at openings in a side wall of the data center 100, and may flow substantially parallel to the floor through the work spaces 106. Examples of data centers in which air enters through side walls are discussed in more detail with respect to FIGS. 3A-3B, and 4A-4C. In some implementations, the cool air flow path 110 can begin in the data center 100 through a cool air supply plenum (not shown) that includes several conduits arranged above the stacks 102. The air flow may also be provided by air circulated through an attic, so that a separate plenum may be provided at one end of a data center 100, and may draw air from an overhead attic space, and then supply air down aisles in the data center 100 through a perforated wall at the one end of the data center 100. The air may be cooled before entering such an end-of-building plenum (e.g., by cooling coils located in the attics) or as it exits such a plenum (e.g., where a wall that separates the plenum from the cool air supply plenum 121 is formed by an array of cooling coils.

In this example, the faces of the stacks 102 adjacent to the aisles are open to the aisles so that air from the aisles can readily enter the racks and pass across the equipment in the racks before exiting the opposite, back sides of the racks. The backs of the racks may similar be open to a warm-air plenum, and may be provided, in some examples, with individual circulation fans for each motherboard or set of motherboards. Such on-rack fans may enable more precise airflow control and balancing in the system so that each rack obtains the level of airflow that it currently needs. For example, the on-rack fans may be controlled by temperature sensors arranged to maintain particular exit air temperatures at the backs of the racks (either before or after the air passes through additional electronic equipment that may be mounted at the back of the racks, such as power supplies.

The computer assemblies in the rows 120 include portions that are substantially closer to the longitudinal axis 113a of the cool air flow path 110 than other portions of the same computer assemblies or portions of adjacent computer assemblies that are closest to the longitudinal axis for the adjacent computer assemblies. In the present example, the stacks 102 are arranged in rows 120 wherein each row 120 includes adjacent stacks 102 having faces that are substantially non-parallel to, and center points that are substantially equidistant along a length of multiple adjacent stacks 102 to, the longitudinal axis 113a of the cool air flow path 110. The stacks 102 are oriented at angles such that the cool air flowing along the cool air flow path 110 enters the stacks 102 by being diverted through substantially less than a right angle.

For example, the cool air flow path 110 can flow along a longitudinal axis 113a, and the stacks 102 can be oriented such that cooling air flows through the stacks generally along a longitudinal axis 113b that is at a substantially right angle to the faces of the stacks 102. As such, the cooling air is diverted away from the longitudinal axis 113a to the longitudinal axis 113b through an angle 113c, which is substantially less than 90 degrees.

In some implementations, the longitudinal axis 113b of the stack 102 is at an angle between about 15 degrees and about 75 degrees from the longitudinal axis 113a of the cool air flow path 110, so that air flowing along the cool air flow path 110 moving at the average air flow turns substantially less than a right angle when turning to align with the longitudinal axis 113b of the stack 102. Also, as the air passes the trailing edge 103 of each stack 102, it will start to expand into a valley 104 created by the saw tooth arrangement of the stacks 102. Some air will move naturally in a lateral direction 106 into the stack 102, while more will move longitudinally. The air that moves longitudinally will tend to be caught by the downstream wall of the next stack 102, and will thus be directed into the next stack 102. Again, the angle of incidence of the air on that back wall will be less than 90 degrees so that the air can be turned more easily and with less static pressure drop. In some implementations, the static pressure drop may be reduced on the order of about 0.050 in-wg to about 0.1 in-wg.

Adjacent and substantially parallel rows 120 of stacks (e.g., the stacks on opposed sides of, and open to, the cool air flow path 110) form a warm air plenum 122 on their sides that are opposed to the cool air plenum 121, the warm air plenum 122 being physically separated from the cool air plenum 121 by the racks and equipment in the racks (and by enclosures around the warm air plenum 122, such as above the top of the racks) so as to prevent mixing of air between the plenums. In some implementations, the rows 120 can be paired such that each first row in a particular pair of rows is separated by a warm air plenum (e.g., the warm air plenum 122) from a second row in the particular pair of rows, and each such pair of rows can be separated from a next adjacent pair of rows by a cool air plenum that creates a human-occupiable aisle (e.g., the cool air plenum 121), where a human-occupiable aisle is one that is sized arranged so that people may work in it and walk in it so as to have convenient access from the aisle to the equipment that is adjacent to the aisle. Technicians may thus conveniently service computers from the aisles via the open fronts of the racks, and could access the warm-air plenum when needed such as through access doors or panels, or by removing racks and getting into the plenum behind the racks (where, at that location, the warm air plenum and cool air plenum would not be fully separated from each other during the duration of the maintenance).

Referring now to FIG. 1B, which shows a section of the area that is show in FIG. 1A, the cool air becomes warm, heated air after it is exposed to electronic equipment the stacks 102, such as by being circulated across motherboards or other components in the stacks 102 (e.g., from front sides of each stack 102 to back sides of each stack 102) and is exhausted into the warm air plenum 122. An exhaust plenum 130 is in fluid communication with the warm air plenum 122 and is configured to capture warm air from the warm air plenum 122. In some implementations, the exhaust plenum 130 can be positioned above the warm air plenum 122 such that the heated air is routed upward into the exhaust plenum 130 by a chimney plenum 132. The exhaust plenum may be ducted and contained, or may include an attic area over the datacenter floor and work area.

In some implementations, the exhaust air plenum 130 may be served by one or more conduits positioned beneath, rather than above, the warm air plenum 122, wherein one or more fans may be configured to draw warm air from the warm air plenum 122 downwardly into the exhaust plenum 130. Such conduits may be located in, or may connect to a raised floor, basement, or other appropriate space. The warm air may be gathered from the exhaust plenum 130 by air handling units that include, for example, one or more fans appropriately sized for the task (e.g., to provide adequate volume and overcome a static pressure drop introduced by coils, equipment, ductwork, and other items). The various plenums may be located in different locations, and the warm air plenum and exhaust plenum may be contiguous with each other. Also, as discussed below, the exhaust air plenum can be eliminated, and air may be re-circulated from the warm-plenum to the cool-air plenum by placing cooling coils at a boundary between the warm-air plenum and the cool-air plenum. In addition, various other forms of ducting may be provided to route the cool or warm air in the system.

As such, cool air is provided to the work space 106, moves along through the work space 106, is drawn through the stacks 102 from their front sides such as by fans mounted on the many trays that are mounted in stacks 102. This air may be heated naturally as it passes over the trays and through power supplies running the computers on the trays, and is then be exhausted into the warm air plenum 122. Each tray is open to the cool air plenum 121, so cool air may enter the tray more easily. In some implementations, each tray may have its own power supply and fan, with the power supply at the back edge of the tray, and the fan attached to the back of the power supply. In some implementations, each computer motherboard may have the power supply attached. All of the fans may be configured or programmed to deliver air to the warm air plenum or at the entrance to the fan and/or power supply (when the fan and/or power supply are located at the back edge of the motherboard), at a single common temperature, such as at a set 113° F. (45° C.), so that the individual fans control their respective speeds to maintain an essentially equal exit temperature (and thus essentially equal temperature rise across the computers) throughout the data center 100. The heated air is then routed through the warm air plenum 122 and into the exhaust plenum 130, and exhausted to outdoor atmosphere through an exhaust 140 so that the air to be supplied to the computer does not mix with, and get diluted by, the warmed air from the computers (i.e., air is taken in from an area substantially separated from where the exhaust air is released).

In another implementation where the air is recirculated after being heated and cooled, circulating air may enter the fronts of the stacks 102 from the work space 106, may pass across heated components in the stacks 102, such as microprocessors and memory chips, and may be exhausted out of the back of the stacks through cooling units (not shown), so that each cooling unit receives heated exhaust air from stacks on opposed sides. The cooling units may be provided with air circulating equipment such as fans and cooling equipment such as cooling coils, so that air is drawn through the coils and exhausted in a cooled state back into the data center work space 106 or into a collection of chimney plenums 132. An example cooling unit will be discussed in the description of FIG. 7. Also, in such systems, some air may be re-circulated and some exhausted, with the exhausted air being replaced by outside air. A control system may be provided to change the proportions of outside and re-circulated air in response to conditions in the system, such as heat load of the equipment in the data center, and wet bulb and dry bulb temperatures of outdoor air.

In some examples, warm air that passes through the stacks 102 may be drawn upward into the exhaust plenum 130. In another implementation, air may enter the warm air plenum 122 behind the computers and be drawn by fans down into an under-floor space (e.g., below a real or false floor), where it may be gathered, circulated through cooling coils, and delivered back into the workspaces 106, such as through perforated floor plates, or may not be cooled and may be exhausted from the data center 100, or some may be cooled and blended with outdoor make-up air.

The cooling units may be individual units that are arranged in an essentially linear row and brought into close contact with the stacks 102. In some examples, two rows of computers may be installed in the data center 100, where each row contains stacks on opposed sides of corresponding cooling units, so that the rows are in a back-to-back configuration against the cooling units. In one example, each stack may be approximately five feet wide (having three bays of computers per stack), and six to eight feet, or 14 or more feet high.

The temperature rise of the air flowing across the trays can be large. For example, the work space 106 temperature may be about 77° F. (25° C.) and the exhaust temperature into the warm air plenum 122 may be set to 113° F. (45° C.), for a 36° F.) rise in temperature. The exhaust temperature may also be as much as 212° F. (100° C.) where the heat generating equipment can operate at such elevated temperature. For example, the temperature of the air exiting the equipment and entering the warm air plenum 122 may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.).

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components so as to draw heat away from the components using the pipes.

Referring again to FIG. 1A, the computers in the stacks 102 are shown as having a circuitry and component layout that are directional to take advantage of the prevalent direction of the cool air flow path 110. In particular, components may be arranged so as to minimize blockage of airflow in the normal direction through the stacks 102, such as by aligning SIMMs or other components from the front to the back of motherboards in the stacks 102.

A number of low-heat producing components 150 (e.g., hard drives) are located at the upstream side (e.g., relative to the cool air flow path 110) of the motherboards, while a number of high-heat producing components 152 are located along the downstream side of the computer. In some implementations, such directional computer component layouts can take advantage of the natural airflow of the cool air flow path to provide additional cooling for the components 152 that produce the greatest amount of heat. For example, the edge of each stack 102 that is further downstream relative to airflow in the aisle can provide a physical diversion of air flowing in the cool air flow path and air may naturally push to that side, so that the side receives a more rapid flow of cooling air compared to the upstream edge. As such, components mounted near the downstream edge of the stack may receive a greater cooling effect than components at the upstream edge (and higher heat-generating components may be placed there).

Figure 2:
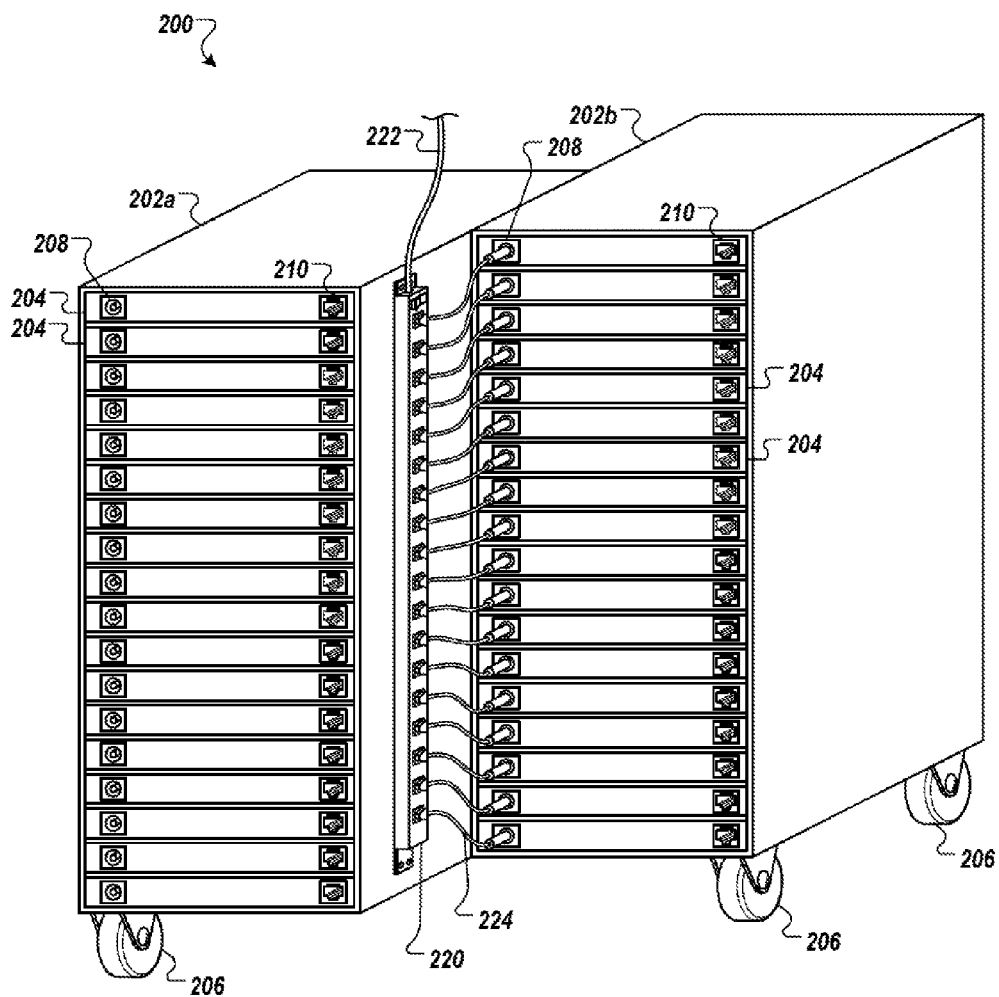
FIG. 2 is a perspective view of a rack that includes two adjacent stacks of computers constructed to be installed in an angled manner in a data center.

Referring now to FIG. 2, a perspective view is shown of a rack 200 that includes two adjacent stacks 202a and 202b of computers 204 constructed to be installed in an angled manner in a data center, such as the data center 100 of FIG. 1. Such an angled construction can ease the installation of racks 200 in a datacenter such that the stacks 202a, 202b will be oriented relative to a flow of cool air at angles substantially less than 90 degrees (as measured by the turn the air must take between moving lengthwise down an aisle and lengthwise through the stacks). In addition, the angled arrangement creates a saw tooth pattern at the sides of the rack 200 so that portions of each stack 202a, 202b extend outward into the airflow relative to other portions, so that the portions that extend into the airflow will catch air and direct it into the rack 200. The rack 200 includes casters 206 or other appropriate friction-reducing assemblies to make the rack 200 easily movable and positionable by a single person.

The stacks 202a, 202b may include pairs of vertical rails (which make up a rectangular frame) to which are attached paired mounting brackets (not shown). Trays that contain computers, such as standard circuit boards in the form of motherboards, may be placed on the mounting brackets. Referring to the stacks 202a, 202b, in one example, the mounting brackets may be angled rails welded or otherwise adhered to vertical rails in the frame of a stack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a stack 202a, 202b and be electrically connected after they are slid into place, or they may be provided with mechanisms, such as electrical traces along one edge, that create electrical and data connections as they are slid into place.

Each computer 204 includes a power connector 208 and a network connector 210. A power strip 220 is mounted to the stack 202a to distribute electrical power to the computers 202 in the adjacent stack 202b. The power strip 220 includes a power cord 222 (or multiple cords when such are required for the amount of power that must be delivered) that connects the power strip 220 to a power distribution system of the data center. The power strip 220 is electrically connected to the power connectors 208 through a number of power cords 224.

Figure 3A:
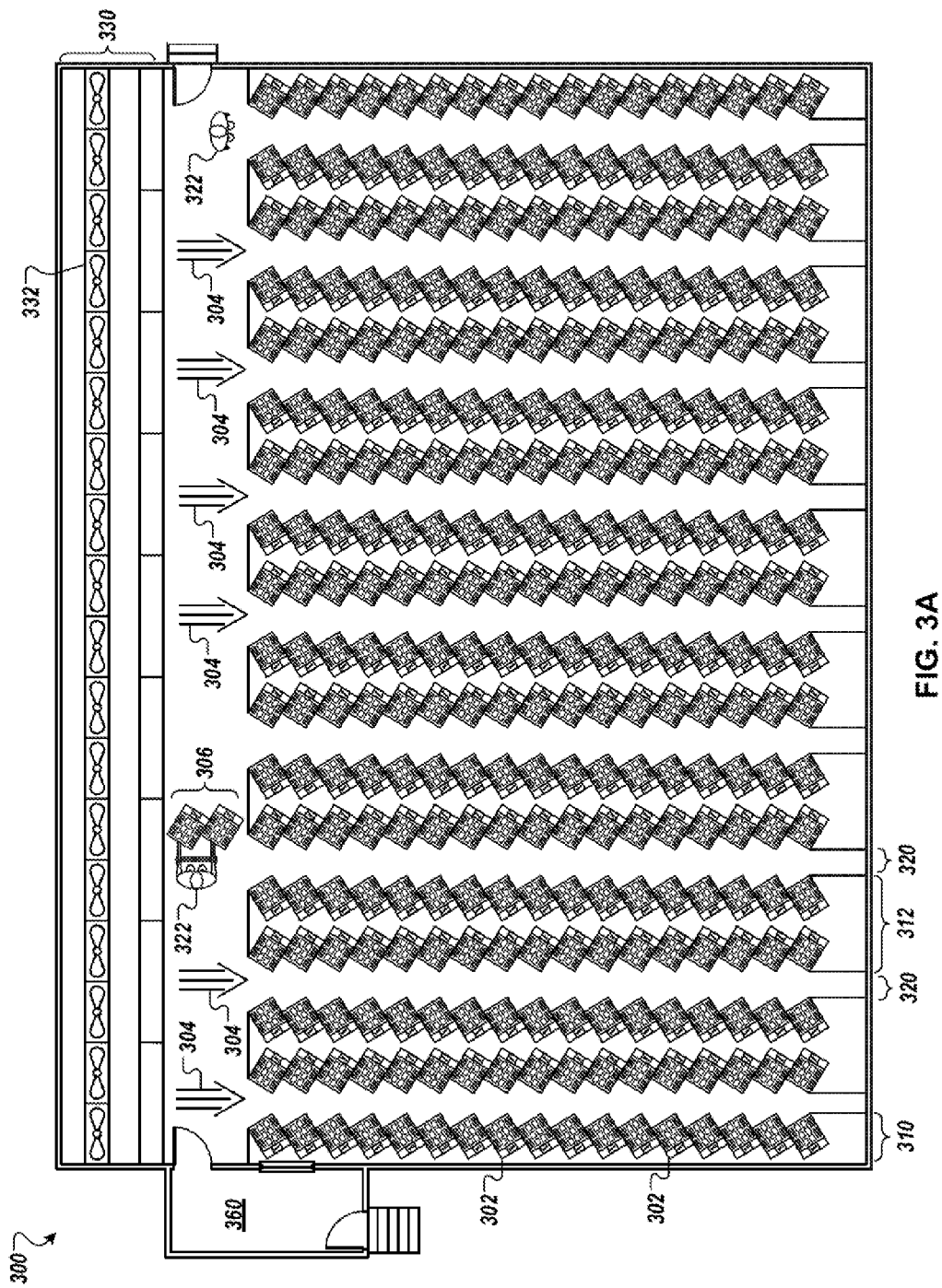
FIG. 3A is a plan view, and FIG. 3B an elevation view, of an example data center, in which each computer stack is angled relative to a supply air flow.

FIG. 3A is a plan view, and FIG. 3B an elevation view, of an example data center 300, in which each computer stack 302 is angled relative to a supply air flow 304. In some implementations, the data center 300 can be the data center 100 of FIG. 1A, where FIG. 3A shows a wider view of many racks arranged in multiple back-to-back pairs of rows in an entire data center. An actual commercial datacenter may be much larger than that shown here, and may include on the order of several hundred thousand motherboards in tens of thousands of stacks, with 8 to 16 microprocessors on each motherboard and multiple cores in each microprocessor. In addition, a commercial data center may include various support components, including electrical power, maintenance, and others that have been omitted here for clarity.

The stacks 302 are arranged in racks (where a single stack or multiple stacks secured together may make up a rack), such as a rack 306 that includes two or more of the stacks 302. The racks 306 are further arranged in rows by being placed adjacent each other, such as a row 310 that runs substantially parallel to the supply air flow 304. Pairs of rows 310 are arranged back-to-back to form a warm air plenum 312. Between adjacent pairs of rows 310 are work spaces 320 within which persons 322 are able to move to access the intake sides of the stacks 302. The work spaces 320 also act as cool air plenums to carry the cool supply air flow 304 to the stacks 302.

The stacks 302 are turned into the cool supply air flow 304, such that the supply air flow 304 is diverted into the intake faces of the stacks 304 at angles of substantially less than 90 degrees (the air turns less than 90 degrees on average between moving down an aisle and moving through a stack).

In the illustrated example, an air-side economizer provides the cool supply air 304. The economizer takes advantage of the availability of cool outdoor ambient air to reduce the cost and power requirements for cooling the data center 300. The outdoor air is provided via an upstream wall 330 that is provided with a plurality of fans 332 to draw in cool outdoor air and provide it to the work spaces 320. In some implementations, the data center 300 may be oriented according to the natural direction of the prevailing winds at the location of the data center 300, such that the natural flow of outdoor air will enter through the upstream wall 330 and provide the cool supply air flow 304, possibly reducing the need for powered air flow provided by the fans 332.

In operation, the cool supply air flow 304 flows through the rows 310 (from the fronts of the stacks to the backs of the stacks), where the air is heated by components of the computers in the stacks 302. The heated air is then passed into the warm air plenums 312 (and such passage may be aided by individual fans mounted at the particular trays or motherboards). The warm air is gathered into the warm air plenums 312 and is exhausted to the outdoors by blowers 340. In some implementations, the blowers 340 can be located at the substantially downstream end of the data center 300. For example, the blowers 340 can expel hot air at a location of the data center 300 that is generally downstream from the upstream wall 330 to prevent heated air from mixing with cool air and re-entering the data center 300.

The data center 300 also includes an auxiliary space 360. In some implementations, the auxiliary space 360 can be an office space or support facility. For example, the auxiliary space 360 may be used for storage and maintenance of computers and other electronic equipment for the data center 300. The auxiliary space may be ventilated using air from the rest of the data center 300 or may include its own HVAC system.

Other common uses may also be made of the auxiliary space 360, and multiple such spaces may be provided at other locations of the data center 300.

The examples of data centers 100, 200 and 300, shown in FIGS. 1a-3b are simplified for the sake of clarity in their corresponding descriptions. In actual implementation, the data centers 100, 200, and 300 would generally be much larger, including many more stacks and rows of computers and would include additional services and structures. For example, typical data centers can include power and networking equipment, office and utility space, as well as wiring and lighting, which are omitted in these examples for sake of clarity.

Figure 4A:
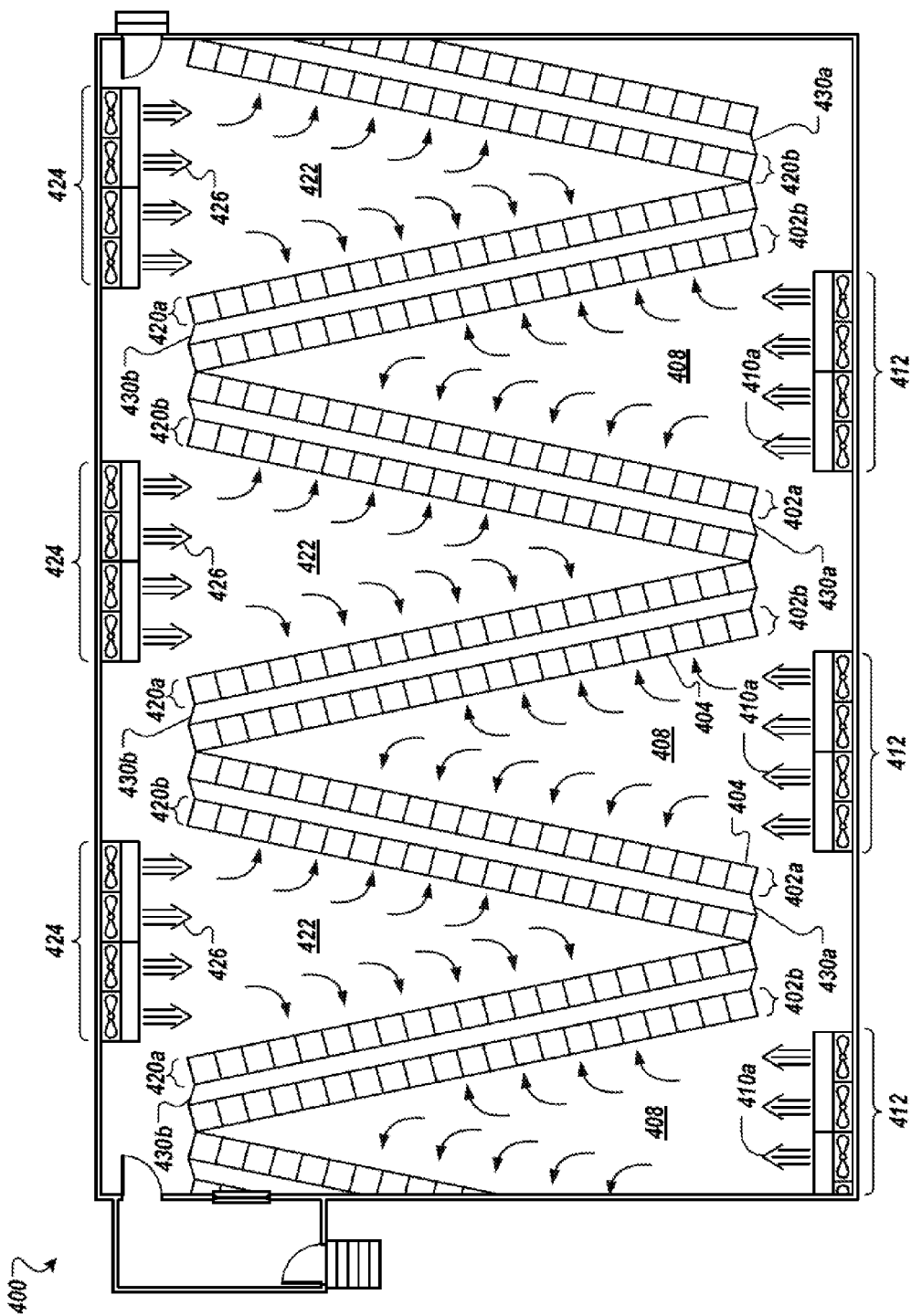
FIG. 4A is a plan view of an example data center, in which rows of computer stacks are angled relative to a supply air flow.

FIG. 4A is a plan view of an example data center 400, in which rows of computer stacks are angled relative to supply air flows. In general, the data center 400 is similar to the data center 300, but the rows themselves are tapered inward downstream of the supply air flow, which in this example starts at opposed walls of the data center 400. In the pictured example, the stacks and racks are arranged in a normal linear configuration without any saw-toothing, but the angling of the rows may have effects on directing airflow similar to the effects discussed for the arrangements in FIG. 3A.

Referring again to FIG. 4A, the rows of the data center form a number of "V" shaped cool air plenums 408. For example, a plurality of rows 402a and 402b are made up of stacks 404 of computers to form a number of cool air plenums 408 that are supplied with a cool air supply flow 410 provided by a number of fan banks 412. In such a configuration, the stacks 404 are arranged in rows, such as the rows 402a, such that the stacks' 404 faces are substantially flush and parallel to each other. The center points of adjacent stacks 404 move progressively closer to the longitudinal central axis of the adjacent cool air plenum 408 in a downstream direction for the average air flow, such as the cool air supply flow 410. In some implementations, the center points of the stacks 404 move progressively closer to the longitudinal central axis of the cool air plenum 408 in a downstream direction for the average air flow along substantially an entire length of the rows 402a and 402b.

Compared to the configuration of rows 120 in FIG. 1A, which are substantially parallel to the cool air flow path 110 and in which the stacks 102 are rotated to partly face the cool air flow path 110, the entire rows 402a and 402b are angled to orient the stacks 404 so the cool air supply flow 410 can enter the stacks 404 at less than a right angle. As such, the cool air supply flow 410 can provide at least some of the movement of cooling air across the computers in the stacks 404, and the cool air supply flow 410 can move from the cool air plenums 408 through the stacks 404 with decreased flow resistance relative to stacks oriented at substantially right angles to the cool air supply flow 410.

Opposed to the plenums 408, on the other side of the data center 400, are a plurality of corresponding V-shaped cool air plenums 422, bounded by angled rows, such as rows 420a and 420b. A number of fan banks 424 provide a cool air supply flow 426 into the cool air plenums 422. The cool air plenums 422 intermesh with the cool air plenums 408, such that the rows 402a are arranged substantially parallel to and back-to-back relative to the rows 420b. Similarly, the rows 402b are arranged substantially parallel to and back-to-back relative to the rows 420a.

Warmed air is captured in the system due to the back-to-back arrangement of the rows of electronic equipment. In particular, the rows 402a and 420b are paired to define a number of warm air plenums 430a, and the rows 402b and 420a are paired to form a number of warm air plenums 430b.

The warm air plenums 430a and 430b are physically separated from the cool air plenums 408 and 422 so as to prevent mixing of warm and cool air between the plenums. Cool air from the cool air supply flows 410 and 426 is routed through the stacks 404 after turning substantially less than a right angle in its average flow direction, is heated by the computers in the stacks, and is exhausted into the warm air plenums 430a and 430b. In some implementations, the heated air is circulated through cooling coils and is returned to the data center 400. In some implementations, the heated air is vented outdoors through the roof or floor of the data center 400, and cool outdoor make-up air is drawn in though the fan banks 412 and 424. In some implementations, some of the heated air is cooled and mixed with cool outdoor air before being returned to the data center.

Figure 4B:
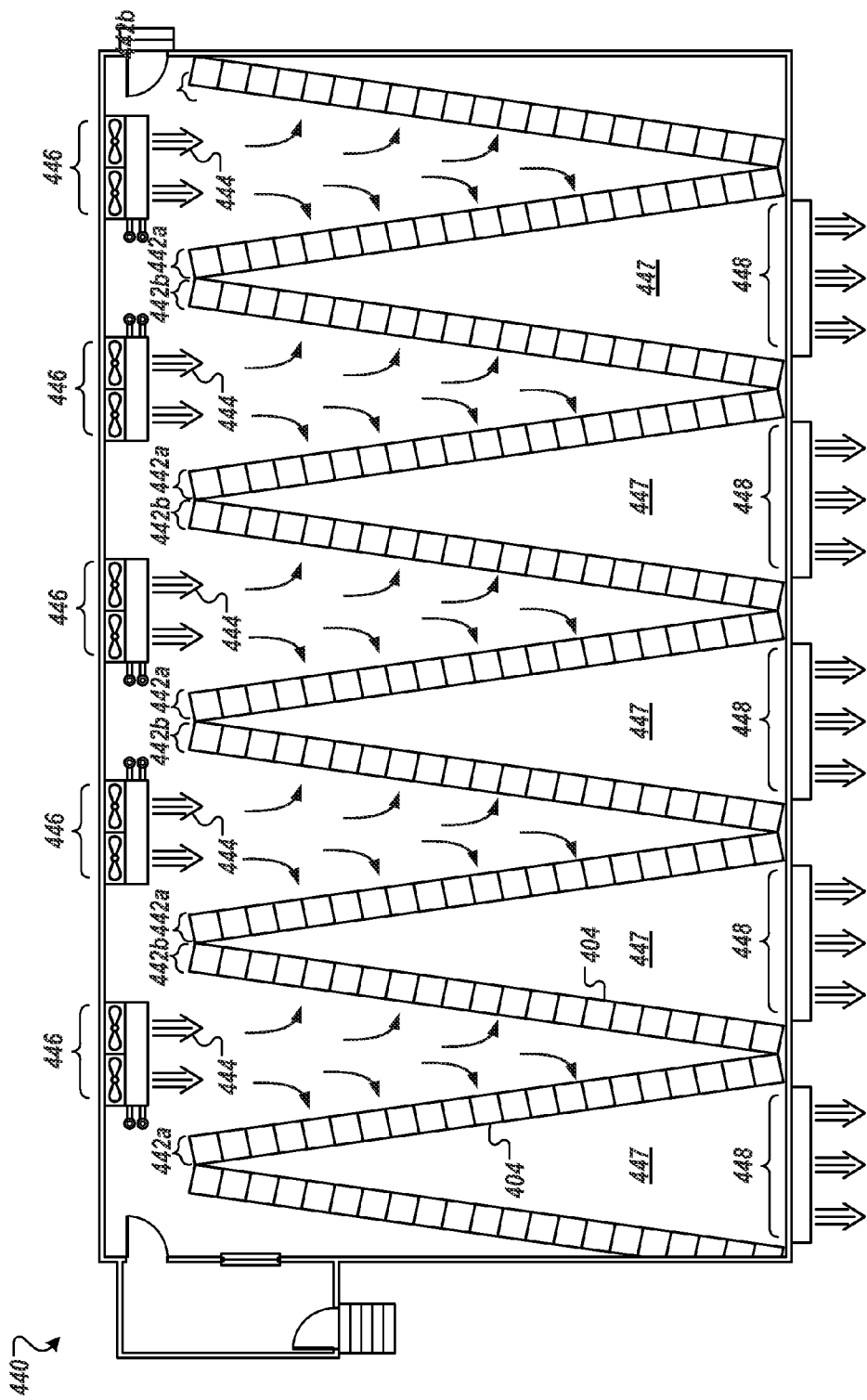
FIG. 4B is a plan view of an example data center, in which rows of computer racks are angled relative to a supply air flow, and the air circulation is of a linear pass-through type.

FIG. 4B is a plan view of an example data center 440, in which a number of rows 442a and 442b of computer stacks 404 are angled relative to a number of supply air flows 444, and the air circulation is of a linear pass-through type. In general, the data center 440 is similar to the data center 400 in FIG. 4A, but the air is passed generally in a single direction through the facility, and exhausted through a wall that is opposite to the wall through which the air was received from the outdoors.

Referring to FIG. 4B, cool outside air is drawn into the data center 440 by a number of fan banks 446 that are located along an upstream wall of the data center 440. The cool air is passed or is drawn through the stacks 404 where the computers in the stacks 404 heat the passing air.

The heated air is expelled into a number of warm air plenums 447 that are physically separated from the supply air flows 444 to prevent mixing of the warm and cool air. The warm air plenums are exhausted to the outdoors though a number of vents 448 formed in a downstream wall of the data center 440, opposite from the fan banks 446. In some implementations, the data center 440 may be oriented along the average natural flow of wind at the data center's location, such that the vents 448 are downwind, on average, from the fan banks 446. As such, the data center 440 can take advantage of naturally occurring outdoor breezes to provide at least some of the movement of air through the data center 440 and carry heated air away from the fan banks 446 to reduce the likelihood of heated air reentering the data center 440.

Figure 4C:
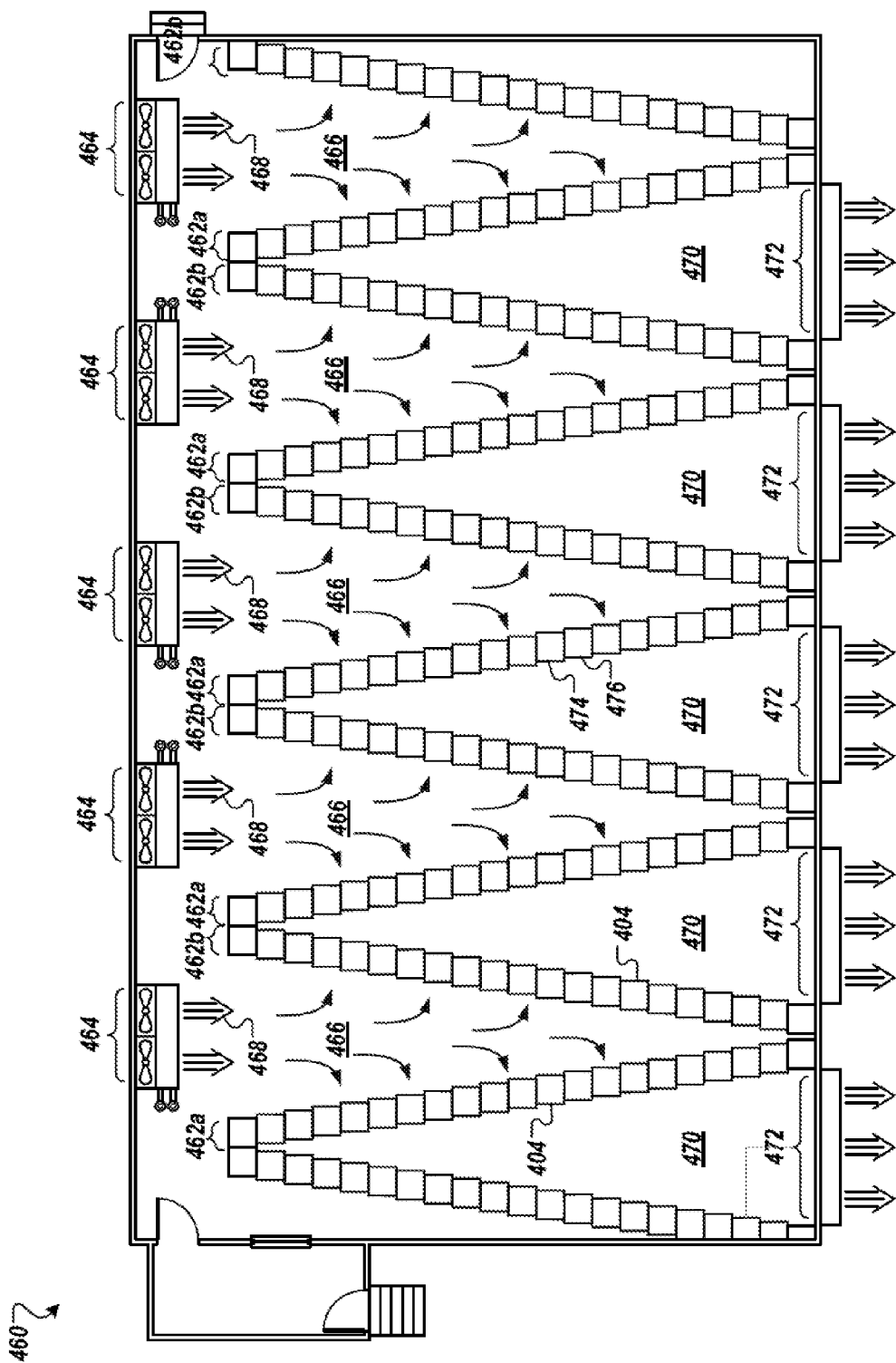
FIG. 4C is a plan view of an example data center, in which adjacent racks are offset down a row.

FIG. 4C is a plan view of an example data center 460, in which adjacent stacks 404 are offset down a number of rows 462a and 462b. In general, the arrangement pictured is similar to that in FIG. 4B, but instead of having even rows that have each been turned somewhat into the airflow, the stacks here are each at a right angle to the airflow but are stepped progressively out into the airflow at each stack so that, even though the air will need to turn a right angle, some of it will be caught and redirected by each of the outwardly-extending edges of each successively adjacent stack.

The air from the supply air flows 468 is directed into the stacks 404 at least partly due to the staggered configuration of the rows 462a and 462b. In some implementations, the staggered configuration of the rows 462a and 462b can take better advantage of the movement of air in the supply air flows 468, when compared to the substantially parallel rows of conventional data center configurations. For example, a downstream stack 476 extends into the cool air plenum 466 further than an upstream stack 474, which is adjacent to, but upstream from, the downstream stack 476 along the average direction of the supply air flow 468. In this configuration, the upstream edge of the downstream stack 478 can divert a portion of the supply air flow 468 toward the face of the upstream stack 474. In another example, the "V" shapes of the cool air plenums my take advantage of the laws of fluid dynamics to improve the efficiency of providing substantially equal volumes of the supply air flows 468 to all the stacks 404 along the rows 462a and 462b.

The air from the supply air flows 468 passes through the stacks 404 where heat producing components are cooled by the supply air, and the heated air is exhausted into a number of warm air plenums 470. The warm air plenums 470 are vented to atmosphere (outdoors) through a plurality of vents 472 in a wall of the data center 460, opposite the fan banks 464. In some implementations the fan banks 464 and the vents 472 can be on opposite sides of the data center 460 to substantially prevent the mixing of warmed and cool air. In this figure, the last several stacks of the left-most row of computers is shown as being truncated by the left-most wall of the data center 460. At such positions, the stacks may be replaced by blanking panels or other structures needed to maintain separation between the air of the cool and warm plenums in a convenient and effective manner.

Figure 5A:
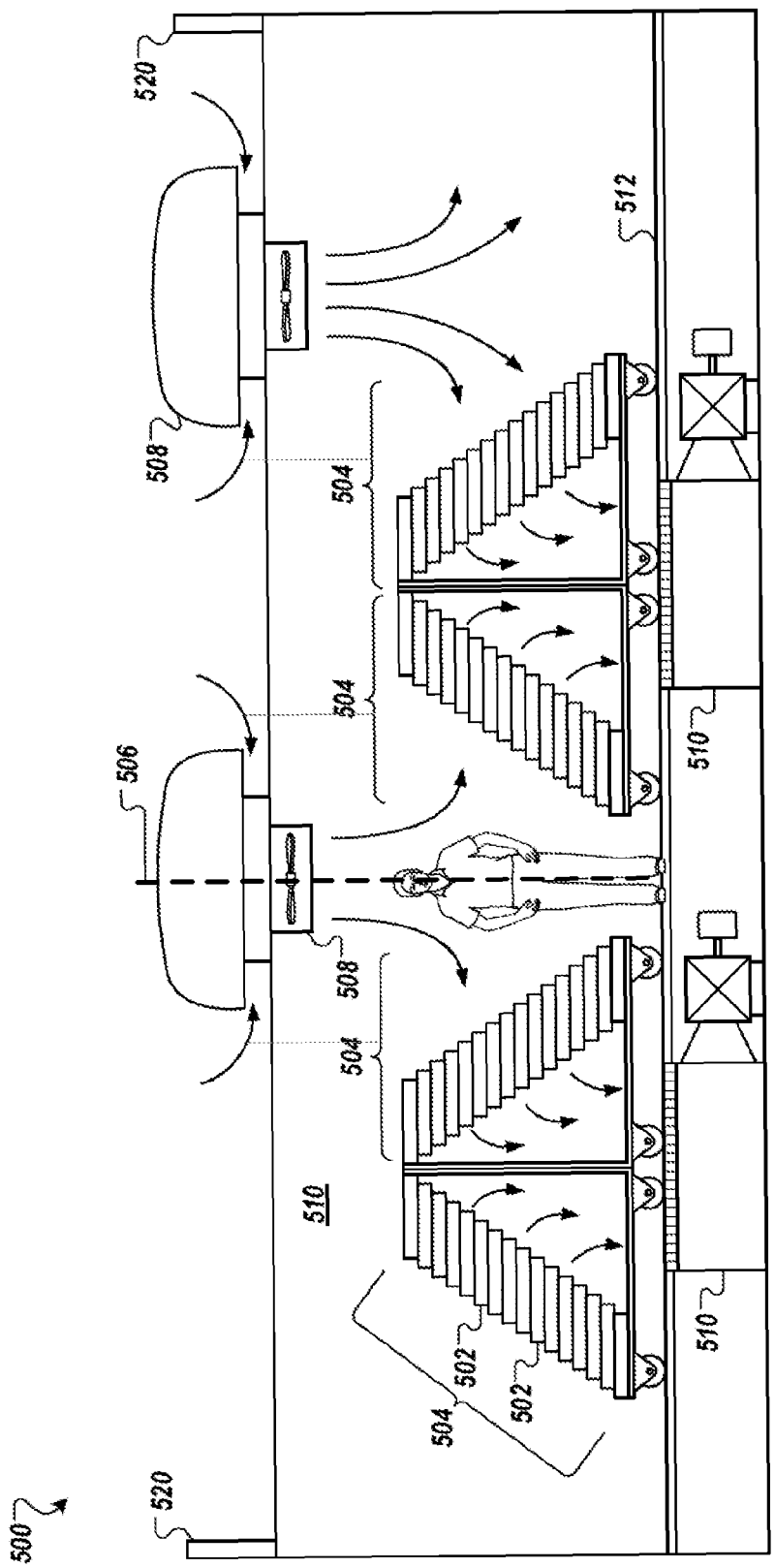
FIG. 5A is an elevation view of an example data center, in which adjacent motherboard assemblies in a stack step backward from a face of the stack.

FIG. 5A is an elevation view of an example data center 500, in which a number of adjacent motherboard assemblies 502 in each of a number of stacks 504 step backward from the faces of their corresponding stacks 504, moving up the stacks 504. Because the air in this example is being supplied downward from a ceiling or overhead ductwork, the effect is similar to that in prior figures, particularly those having stepped stacks that extend progressively further into an air flow from a supply air plenum.

In particular, motherboard assemblies 502 in the stacks 504 are located progressively farther from or closer to a substantially vertical longitudinal axis of a supply air plenum, such as a longitudinal axis 506 of one of a number of supply air plenums 508, moving down the stacks 504, so that faces of adjacent (up-and-down) motherboard assemblies 502 in the stack 504 step progressively backward or forward from the supply air plenum 508. In other words, each successive adjacent level of a stack steps slightly backward from the previous level, so that a small portion, or lip, of each level sticks out into the main airflow to catch and divert some of the airflow. In some implementations, the motherboard assemblies 502 can be stepped back about 1 inch to 2 inches or more from next-adjacent motherboard assemblies 502.

In the illustrated example, cool air is provided into a work space 510 of the data center 500 by the supply air plenums 508 located substantially overhead relative to facing pairs of the stacks 504. The cool air is directed generally along the longitudinal axis 506 to the fronts of the stacks 504. The stepped configuration of the stacks 504 at least partly causes the cool air to be diverted through the stacks 504, such that the air cools the motherboards. The air, warmed by the motherboard assemblies 502, then exits the rear of the stacks 504 under the force of the supply air plenums 508, fans mounted in the motherboard assemblies 502, and/or by the force of a number of blowers 510 located beneath a floor 512 of the data center 500. In some implementations, the warmed air can be cooled (e.g., by cooling coils, heat exchangers) and returned to the work space 510. In some implementations, the warmed air can be exhausted to atmosphere by the blowers 510.

The roof of the data center 500 includes a parapet 520. The parapet 520 extends upward from at least part of the roof of the datacenter 500. In some implementation, the parapet 520 can further prevent warmed data center air, which is expelled to the outdoors, from mixing with cool outdoor air and re-entering the datacenter 500 through the supply air plenums 508. In other words, the parapet 520 may help prevent short-circuiting of the air that might otherwise occur.

Figure 5B:
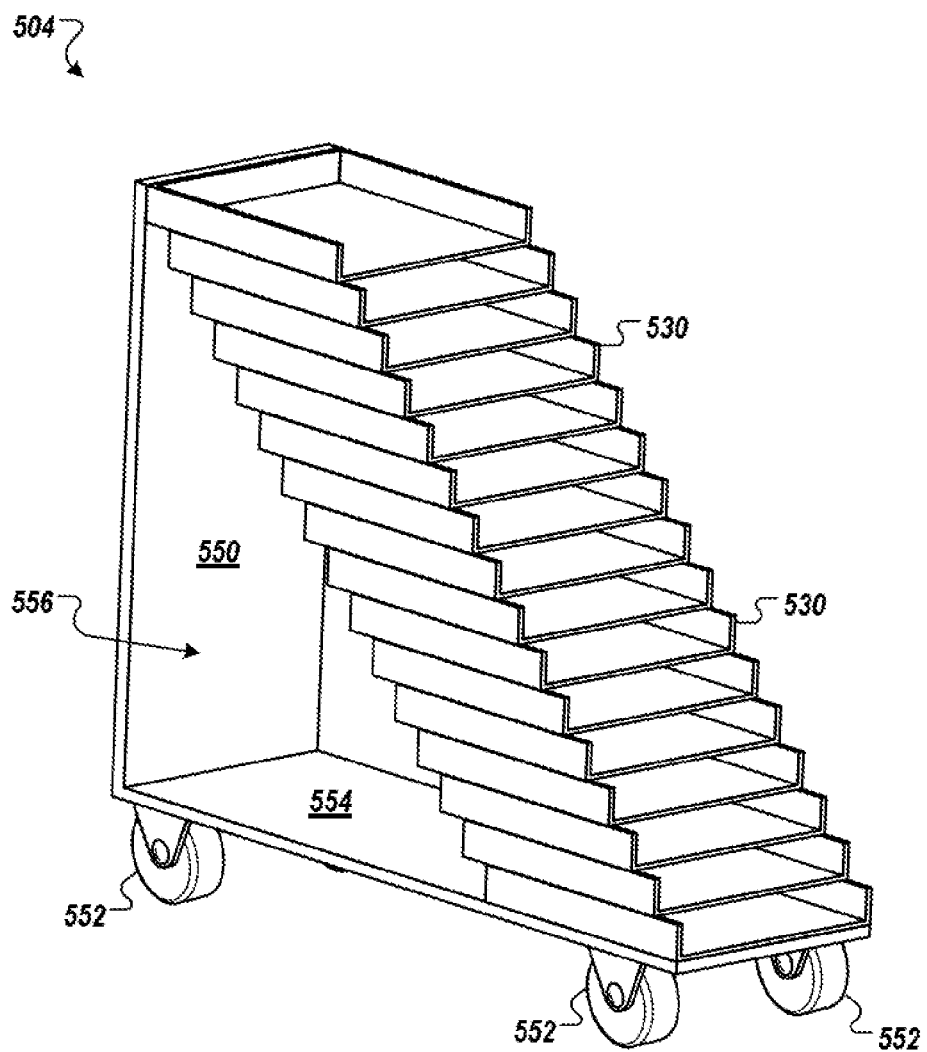
FIG. 5B is a perspective view of one of the stacks from FIG. 5A.

FIG. 5B is a perspective view of one of the stacks 504 from FIG. 5A. The stack 504 includes a number of "U" shaped trays 530 that are arranged in a progressively stepped back arrangement. The trays 530 accept the insertion of the motherboard assemblies 502 to support the motherboard assemblies in the stepped back arrangement. In particular, the motherboard assemblies 502 may simply be slide into place and laid on top of one of the trays 530, which may be made of or covered with an electrically insulative material.

The stack 504 includes a supporting frame 550 that supports and positions the trays 530. In some implementations, the frame 550 can be constructed of solid materials, such as sheets of metal, wood, plastic, or other appropriate material. In some implementations, the frame 550 can be constructed of beams or rods of solid material, such as angle iron, aluminum extrusions, tube steel, or other appropriate materials.

The stack 504 includes a number of casters 552 that extend down from a floor 554 of the frame 550. The casters allow the stack 504 to be moved and rearranged easily by data center personnel. For example, a data center technician can move the stack 504 from one location in a data center to another location by rolling the stack 504 about on the casters 552.

Cool air that passes through the motherboard assemblies 502 is warmed by computers in the trays 530 and then exhausted into a cavity 556. In some implementations, a number of stacks 504 can be arranged in a side-by-side adjacent configuration, in which the cavities 556 can form a continuous warm air plenum that extends in an open configuration up and down a row between the various stacks but is substantially sealed from a workspace in front of the racks so that warm air does not mix with cool air.

In some implementations, the warmed air can flow through vents (not shown) in the floor 554 of the stack 504, and the warmed air can be collected into underfloor warm air plenums through inlet vents formed in the floor (e.g., a raised floor) of the data center 500. In such a configuration, the stack 504 may also include skirting (not shown) about its bottom front edge along the floor 554, such that warmed air passing through the space between the floor 554 and the floor of the data center 500 may be substantially separated from the cool supply air, while not impeding the use of the casters 552.

In some implementations, various combinations of stepped (as shown in FIG. 5B) and horizontally rotated (as shown in FIG. 1A) trays 530 may be implemented. In some implementations, the trays 530 can be vertically inclined (e.g., pitched). For example, the trays 530 can be oriented with their intake ends pitched relatively higher than their exhaust ends, or vice versa. Orientations with relatively higher intake ends may be implemented to reduce the angle through which vertically downward flowing cooling air is diverted in order to flow through the motherboard assemblies 502. Orientations with relatively higher exhaust ends may be implemented to take advantage to the convective flow of air that naturally occurs when cool supply air enters a lower portion of the tray 530 and is heated by the components of the motherboard assembly 502 mounted thereupon, which will cause the air to rise and escape out the rear thereby drawing additional cool air in through the inlet and reducing the amount of power required to move air across the motherboard assembly 502.

Figure 6A:
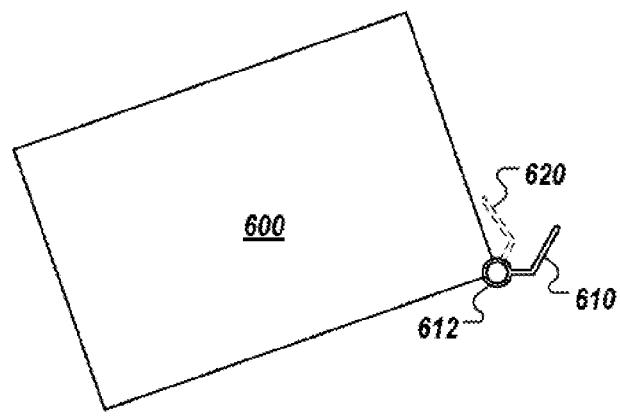
FIG. 6A shows a top view of a computer stack provided with a movable air catching lip.

FIG. 6A shows a top view of a computer stack 600 that has been provided with a movable air catching lip 610. In some implementations, the stack 600 can be the stacks 102, 202a-202b, 302, or 404 of FIGS. 1A, 2, 3A, and 4, respectively. In general, the lip 610 extends from a downstream corner of the stack 600. The lip 610 is an angled (as shown), straight, or curved assembly, the position of which is adjustable by rotating the lip 610 about a hinge 612. In use, the lip 610 is adjustably extended to divert a flow of air toward the stack 600.

The lip 610 can be oriented to a retracted position 620. In some implementations, the lip 610 can be retracted to reduce the amount of air that is diverted into the stack 600. For example, the stack 600 may be operating in a configuration that produces substantially less heat than it is capable of producing (e.g., some of the trays are empty, the computers in the stack 600 are running at less than full capacity), and the lip 610 may be retracted toward the stack 600 to allow more air to pass on to downstream stacks 600, and to catch less of the air for the stack 600 on which it is mounted. In some implementations, the lip 610 can be retracted while the stack is being moved. For example, the lip 610 can be retracted so as to not catch or snag nearby objects as the stack 600 is being rolled through a data center. The hinges for the lip 610 may have enough inherent friction so that the lip 610 can be set in a position by a technician and can be expected to stay in that position until it is manually moved again by another user.

Figure 6B:
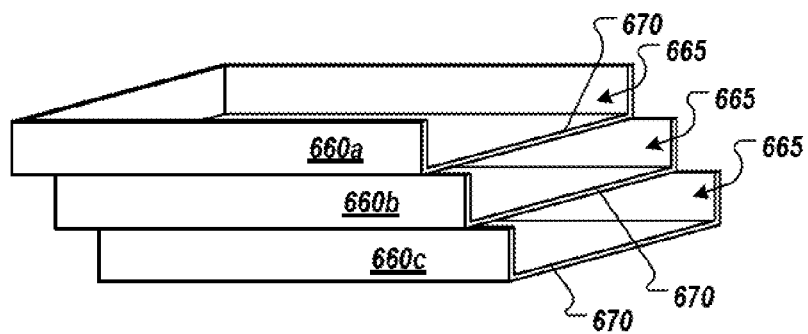
FIG. 6B shows a series of vertically adjacent motherboard assemblies that step back from their open faces.

FIG. 6B shows a series of vertically adjacent trays 660a-660c that step back from their open faces 665. In general, motherboard assemblies mounted in the trays 660a-660c are located progressively farther from the vertical longitudinal axis of a supply air plenum, so that faces of adjacent motherboard assemblies in the stack step backward or forward from the cool air plenum when moving upward in the stack. In some implementations, the trays 660a-660c are stepped back about 1 inch to 2 inches or more from next-adjacent trays.

In some implementations, the lip 610 can be mounted horizontally along a front edge 670 of some or all of the trays 660a-660c in the stack 600. Such a configuration can be used with vertically stepped back stacks, such as the stacks 504 of FIGS. 5A-5B. There is no lip on the top of each tray, so that air can pass by the top of the tray, and be caught and directed by the bottom edge of the tray and/or a motherboard assembly in the tray. As such, the amount of vertically moving cooling air diverted toward the trays 660a-660c can be adjusted.

Figure 7:
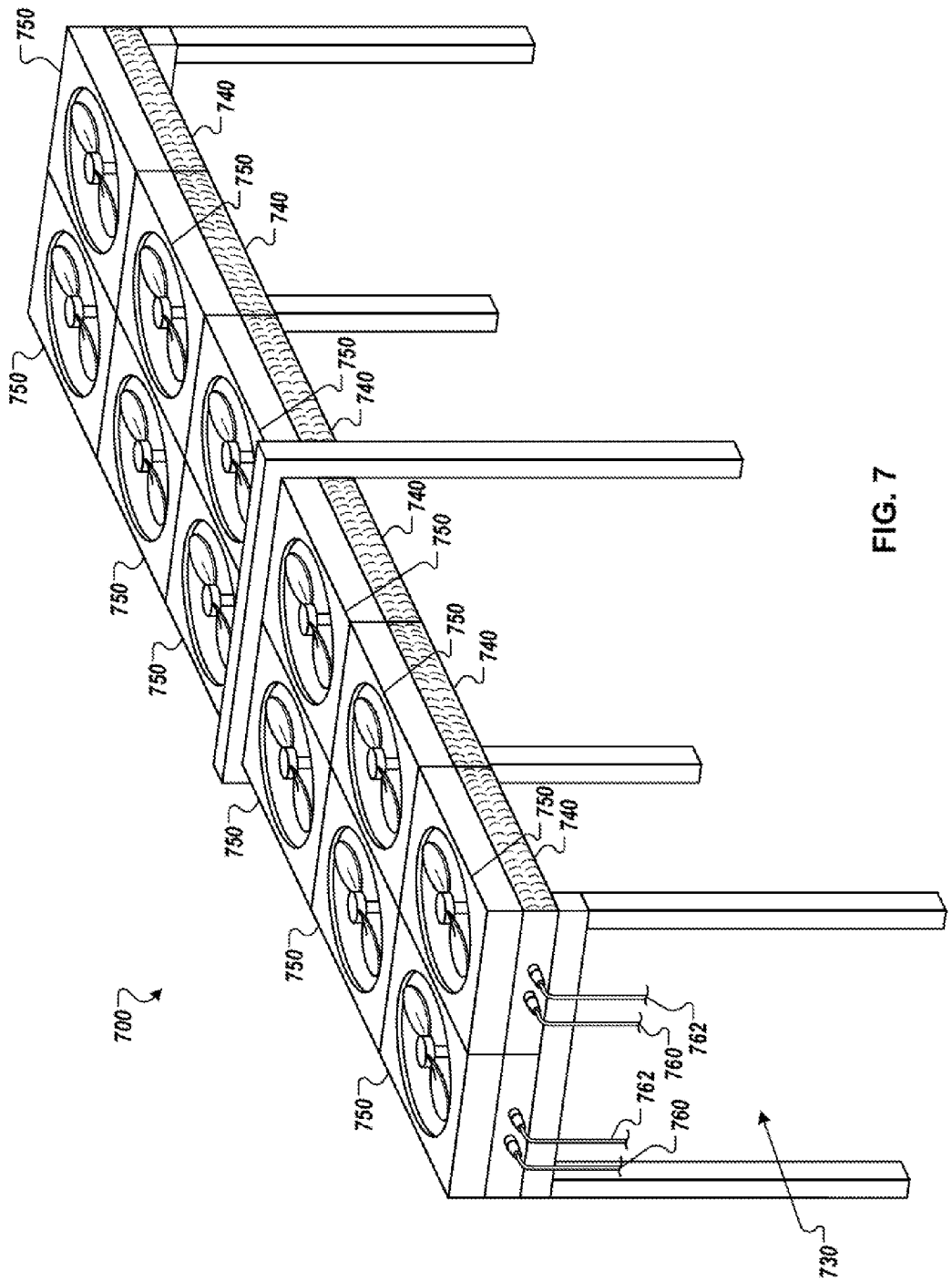
FIG. 7 shows a cooling and circulation rack for one or more rows of computer racks.

FIG. 7 shows a cooling and circulation assembly 700 for one or more rows of computer racks. In some implementations, the assembly 700 can be positioned between rows of racks, over warm air plenums. For example, the assembly 700 can be implemented substantially overhead of the warm air plenum 104, 312, or 430a-430b of FIGS. 1A, 3A, and 4A respectively. In another example, adjacent stacks 504 of FIG. 5A-5B may be spaced apart to accommodate the inclusion of the assembly 700 in between, substantially capping the warm air plenum between the spaced apart stacks 504. The stacks can be backed up to the assembly 700 and positioned with their back edges located slightly under the assembly 700 so as to substantially block the flow of air between a cool workspace and an area below the assembly 700. A warm air plenum space is generally indicated by the arrow 730.

Warm air in the warm air plenum space 730 can thus be drawn through a collection of cooling coils 740 by a plurality of fans 750. The cooling coils 740 are supplied by cooling fluid inlet lines 760 and outlet lines 762 to circulate a cooling fluid, such as water, glycol, carbon dioxide, R134a, or other appropriate coolant through the cooling coils 740. The cooling fluid may or may not change phase as it passes through the coils 740.

Warm air, drawn through the cooling coils 740, exchanges thermal energy with the cooling fluid, cooling the air and warming the fluid. In some implementations, the cooled air expelled by the fans 750 may be provided directly back to a cool air work space (e.g., directly above the computer racks).

In some implementations, the cooled air may be expelled into a cool air plenum and distributed to locations in a cool air work space.

In some implementations, the warmed cooling fluid can flow to a cooling unit where the fluid is cooled and then returned to the cooling coils 740. For example, the cooling fluid can be cooled by chillers, heat exchangers, evaporative coolers, geothermal cooling, or by other appropriate methods for cooling the cooling fluid before it is returned to the assembly 700.

Figure 8:
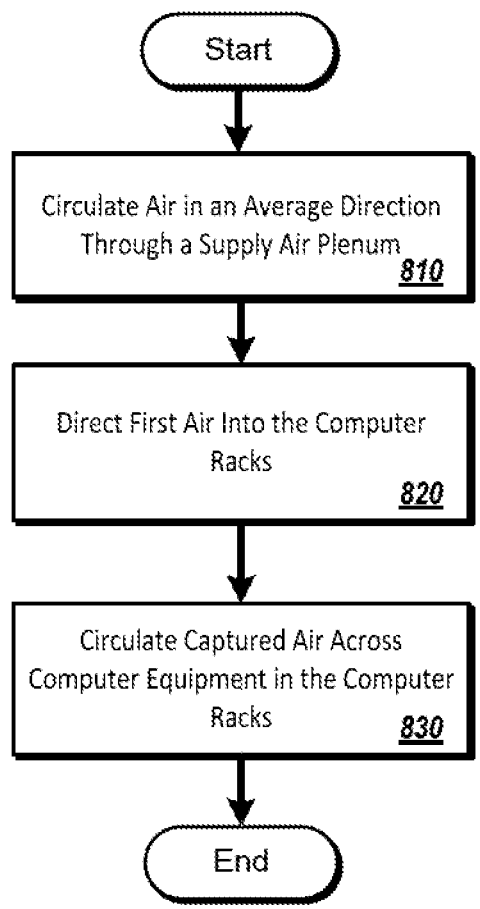
FIG. 8 shows a flow diagram of an example process for cooling stacks of computers.

FIG. 8 is a flow diagram of an example process 800. In general, the process 800 is a process performed by an air handling system for cooling a data center, such as the data center 100 or 200, by providing cooled air to flow substantially along cool air plenums of the data center, such as is discussed in description of FIGS. 1A-1B, 2, 3A-3B, 4A-4C, and 5A. The process 800 begins when a mass of air is circulated (810) in an average direction through a supply air plenum. For example, the cool air flow path 110 flows through the cool air plenum 121 generally along the longitudinal axis 113a.

The first air is directed (820) from the supply air plenum into the computer racks, and the captured air is circulated (830) across the computer equipment in the computer racks. In some implementations, a face portion of the rack system extends into the supply air plenum substantially farther than other face portions of the rack system to direct the first air. In some implementations, a face portion of the rack system extends into the supply air plenum farther than a face portion of a next adjacent rack system extends into the supply air plenum to direct the first air.

In some implementations, the face portion of the rack system can be angled between about 15 degrees and about 75 degrees relative to an average direction of air flow in the supply air plenum. In some implementations, such as in the data center 100, the first row of stacks can include adjacent stacks, center points of which move progressively closer to a line defining an average direction of airflow in the supply air plenum in a downstream direction for air flow in the supply air plenum.

In some implementations, the center points can move progressively closer to the line in a downstream direction for air flow along substantially an entire length of the first row. In some implementations, the first row of stacks can include adjacent stacks having faces that are substantially non-parallel to, and center points that are substantially equidistant along a length of multiple adjacent stacks to, the longitudinal axes of the supply air plenum.

A number of embodiments have been described. Nevertheless, it will be understood that various modifications can be made without departing from the spirit and scope of the invention.

In addition, the logic flows depicted in the figures do not require the particular order shown, or sequential order, to achieve desirable results. In addition, other steps can be provided, or steps can be eliminated, from the described flows, and other components can be added to, or removed from, the described systems. Accordingly, other embodiments are within the scope of the following claims.

What is claimed is:
1. A computer data center system, comprising:
a plurality of stacks, each of the stacks having a plurality of computer motherboard assemblies arranged vertically with respect to one another;
a first row of the plurality of stacks, the row defined by a first subset of the plurality of stacks arranged adjacent to each other in a horizontal line; and a cool air supply plenum adjacent to the first row of the plurality of stacks, the cool air supply plenum (a) being arranged to supply cool air to a first side of the first row of the plurality of stacks for cooling the computer motherboard assemblies placed in the stacks of the first row of the plurality of stacks, and (b) having a longitudinal axis substantially parallel with an average air flow of cooling air in the plenum, wherein the computer motherboard assemblies in the first row of the plurality of stacks include portions that are substantially closer to the longitudinal axis of the cool air supply plenum than (a) other portions of the same computer motherboard assemblies; or (b) portions of adjacent computer motherboard assemblies that are closest to the longitudinal axis for the computer motherboard assemblies in adjacent stacks of the first row of the plurality of stacks.

2. The system of claim 1, wherein ones of the stacks in the first row of the plurality of stacks define longitudinal axes that intersect at a substantially right angle their front faces that face the cool air supply plenum, the longitudinal axes of the stacks in the first row of the plurality of stacks being at an angle between 15 degrees and 75 degrees from the longitudinal axis of the cool air supply plenum, so that air in the cool air supply plenum moving at the average air flow turns substantially less than a right angle when turning to align with the longitudinal axes of the stacks in the first row of the plurality of stacks.

3. The system of claim 2, wherein the first row of the plurality of stacks is arranged such that the center points of the stacks arranged adjacent to each other in the first row move progressively closer to the longitudinal axis of the supply air plenum in a downstream direction for the average air flow.

4. The system of claim 3, wherein the center points move progressively closer to the longitudinal axis of the supply air plenum in a downstream direction for the average air flow along substantially an entire length of the first row.

5. The system of claim 2, wherein the first row of the plurality of stacks is arranged such that the stacks arranged adjacent to each other have faces that are substantially non-parallel to, and center points that are substantially equidistant along a length of the first row of the plurality of stacks to, the longitudinal axes of the supply air plenum.

6. The system of claim 2, wherein particular computer motherboard assemblies in a first stack of the plurality of stacks are located progressively farther from the longitudinal axis of the supply air plenum, so that faces of adjacent ones of the computer motherboard assemblies in the first stack step backward or forward from the cool air plenum when moving upward in the first stack.

7. The system of claim 6, wherein the computer motherboard assemblies are stepped back about 1 inch or more from next-adjacent computer motherboard assemblies.

8. The system of claim 3, wherein the longitudinal axis of the supply air plenum is vertical.

9. The system of claim 2, further comprising a second row of the plurality of stacks adjacent to and parallel with the first row of stacks, the first row and second row arranged on opposed sides of, and open to, the supply air plenum, and having warm air plenums on their sides that are opposed to the supply air plenum, the warm air plenum being physically separated from the supply air plenum so as to prevent mixing of air between the plenums.

10. The system of claim 3, wherein the supply air plenum receives air from a side wall of the data center, and the warm air plenum exhausts air to atmosphere through a roof or floor of the data center.

11. The system of claim 3, wherein the supply air plenum receives air from a first side wall of the data center, and the warm air plenum exhausts air to atmosphere through a second side wall of the data center.

12. The system of claim 10, wherein the first wall is on an opposed side of the data center to the second wall, so as to prevent mixing of intake air and exhaust air.

13. The system of claim 3, further comprising a plurality of paired rows of stacks, each first row in a particular paired row separated by a warm air plenum from a second row in the particular paired row, and each paired row separated from a next adjacent paired row by a supply air plenum.

14. The system of claim 1, further comprising a fan-powered ventilation system arranged to circulate air from back sides of the plurality of stacks, through cooling coils and to the supply air plenum.

15. The system of claim 1, wherein the ventilation system is located immediately above an upper surface of the plurality of stacks, and supplies cooled air into a workspace in the data center.

16. A method for providing air circulation in a data center, the method comprising:
   circulating a mass of air in an average direction through a supply air plenum that has a longitudinal axis; and
   directing first air from the supply air plenum into a plurality of computer racks, each computer rack having a plurality of computer motherboard assemblies arranged vertically with respect to one another, particular ones of the computer racks being arranged adjacent to particular other ones of the computer racks in one or more rows of computer racks, and circulating the captured air across computer equipment in the plurality of computer racks,
   wherein, for a particular computer rack of a first row of the one or more rows of computer racks, the first air is directed by (a) a face portion of the particular computer rack that extends into the supply air plenum substantially farther than other face portions of the particular computer rack, or (b) a face portion of the particular computer rack that extends into the supply air plenum farther than a face portion of a next adjacent computer rack extends into the supply air plenum.

17. The method of claim 16, wherein the face portion of the particular computer rack is angled between 15 degrees and 75 degrees relative to an average direction of air flow in the supply air plenum.

18. The method of claim 17, wherein the first row of computer racks includes computer racks arranged adjacent to each other and whose center points move progressively closer to a line defining an average direction of airflow in the supply air plenum in a downstream direction for air flow in the supply air plenum.

19. The method of claim 18, wherein the center points move progressively closer to the line in a downstream direction for air flow along substantially an entire length of the first row of computer racks.

20. The method of claim 18, wherein the first row of computer racks includes computer racks arranged adjacent to each other and having faces that are substantially non-parallel to, and center points that are substantially equidistant along a length of the row to, the longitudinal axis of the supply air plenum.

21. The method of claim 17, wherein particular motherboard assemblies in a particular one of the plurality of computer racks are located progressively farther from the longitudinal axis of the supply air plenum, so that faces of the vertically arranged adjacent motherboard assemblies in the particular computer rack steps backward or forward from the cool air plenum when moving upward in the selected computer rack.

22. The method of claim 16, wherein the longitudinal axis of the supply air plenum is vertical.

23. The method of claim 16, further comprising providing a second row of the one or more rows of computer racks adjacent to and approximately parallel with the first row of computer racks, the computer racks of the second row of computer racks on opposed sides of, and open to, the supply air plenum, and having warm air plenums on their sides that are opposed to the supply air plenum, the warm air plenum being physically separated from the supply air plenum so as to prevent mixing of air between the plenums.

24. The method of claim 23, wherein the supply air plenum receives air from a side wall of the data center, and the warm air plenum exhausts air to atmosphere through a roof or floor of the data center.

25. The method of claim 23, further comprising providing a plurality of paired rows of the plurality of computer racks, each first row in a particular paired row separated by a warm air plenum from a second row in the particular paired row, and each paired row separated from a next adjacent paired row by a supply air plenum.

26. The method of claim 16, further comprising providing a fan-powered ventilation system arranged to circulate air from back sides of the plurality of computer racks, through cooling coils and to the supply air plenum.

27. The method of claim 16, further comprising providing a fan-powered ventilation system arranged to circulate air from back sides of the plurality of computer racks, through cooling coils and to the supply air plenum.

\* \* \* \* \*